United States Patent
Sicard

(10) Patent No.: US 9,588,170 B2
(45) Date of Patent: Mar. 7, 2017

(54) SYSTEMS AND METHODS FOR TEST CIRCUITRY FOR INSULATED-GATE BIPOLAR TRANSISTORS

(71) Applicant: Thierry Sicard, Austin, TX (US)

(72) Inventor: Thierry Sicard, Austin, TX (US)

(73) Assignee: NXP USA, INC., Austin, TX (US)

(*) Notice: Subject to any disclaimer, the term of this patent is extended or adjusted under 35 U.S.C. 154(b) by 209 days.

(21) Appl. No.: 14/341,269

(22) Filed: Jul. 25, 2014

(65) Prior Publication Data

US 2016/0025800 A1   Jan. 28, 2016

(51) Int. Cl.
| | |
|---|---|
| *G01R 31/02* | (2006.01) |
| *G01R 31/26* | (2014.01) |
| *G01R 35/00* | (2006.01) |
| *H03K 17/082* | (2006.01) |
| *H01L 29/739* | (2006.01) |

(52) U.S. Cl.
CPC ......... *G01R 31/2608* (2013.01); *G01R 35/00* (2013.01); *H01L 29/7393* (2013.01); *H03K 17/0822* (2013.01); *H03K 2217/0027* (2013.01)

(58) Field of Classification Search
CPC ............ G01R 31/2601; G01R 31/2608; G01R 31/261; G01R 31/2612; G01R 31/2621; G01R 31/2623; G01R 31/2625
USPC ......... 324/537, 762.02, 762.08, 762, 762.09; 327/432, 434, 109
See application file for complete search history.

(56) References Cited

U.S. PATENT DOCUMENTS

| | | | | |
|---|---|---|---|---|
| 5,596,280 | A * | 1/1997 | Riggio, Jr. | G01R 31/27 324/537 |
| 7,274,241 | B2 * | 9/2007 | Ho | H02M 1/44 327/170 |
| 7,400,130 | B2 * | 7/2008 | Naujokat | G01R 31/31724 324/76.48 |
| 8,004,304 | B2 * | 8/2011 | Tametani | H01L 22/34 324/762.02 |
| 2005/0017788 | A1 * | 1/2005 | Inoue | H03K 17/0406 327/432 |
| 2007/0252583 | A1 * | 11/2007 | Hokoiwa | G01R 31/3016 324/750.3 |
| 2009/0309634 | A1 * | 12/2009 | Yang | H02M 1/08 327/109 |
| 2012/0126859 | A1 * | 5/2012 | Kawamoto | H03K 17/163 327/108 |
| 2014/0266401 | A1 * | 9/2014 | Park | H03K 3/012 327/434 |
| 2016/0028219 | A1 * | 1/2016 | Habu | H03F 1/52 361/101 |

* cited by examiner

*Primary Examiner* — Arleen M Vazquez
*Assistant Examiner* — Steven Yeninas

(57) ABSTRACT

A saturation edge detection circuit for testing a saturation level in an insulated gate bipolar transistor ("IGBT") includes a first input operable to receive an on signal, a second input coupled to an IGBT driver circuit, and an output coupled to a control electrode of the IGBT. The output indicates a change in a state of a saturation voltage associated with the IGBT during operation of the IGBT.

20 Claims, 5 Drawing Sheets

SYSTEMS AND METHODS FOR TEST CIRCUITRY FOR INSULATED-GATE BIPOLAR TRANSISTORS

BACKGROUND

Field

This disclosure relates generally to semiconductor devices, and more specifically, to test circuitry for insulated-gate bipolar transistors.

Related Art

Power devices are electronic components designed to be tolerant of the high currents and voltages that are present in power applications such as three-phase electric motors, automotive electronics, power supplies, telecommunications, and other applications that require devices to operate at currents in the range of tens up to hundreds of amperes (A).

Insulated-gate bipolar transistors (IGBTs) are designed for power applications and combine metal-oxide-semiconductor (MOS) gate control and a bipolar current flow mechanism. An IGBT incorporates features of both a metal-oxide-semiconductor field effect transistor (MOSFET) and a bipolar junction transistor (BJT). IGBTs have higher current density than MOSFETs and faster switching characteristics than BJTs. IGBTs are a primary choice today for high-power (>10 kW), low to medium frequency (up to 30 kHz) applications.

Over current protection circuitry is often included in devices to protect IGBTs in over current conditions. The protection circuitry detects the over-current condition and prevents the IGBT from operating when the over-current condition is detected. One type of over-current protection circuitry is a de-saturation circuit that detects voltage build-up across the collector and emitter while the device is fully on. If the voltage exceeds a specified limit the associated IGBT is placed in non-active mode.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods disclosed herein enable over-current protection circuits to be tested for proper functionality before applying voltage to devices containing insulated-gate bipolar transistors (IGBT). In this manner, if the over-current protection circuit is not functioning properly, the device can prevent voltage from being applied to the IGBT, thereby avoiding potential damage to the IGBT and/or other components in the device.

Figure 1:
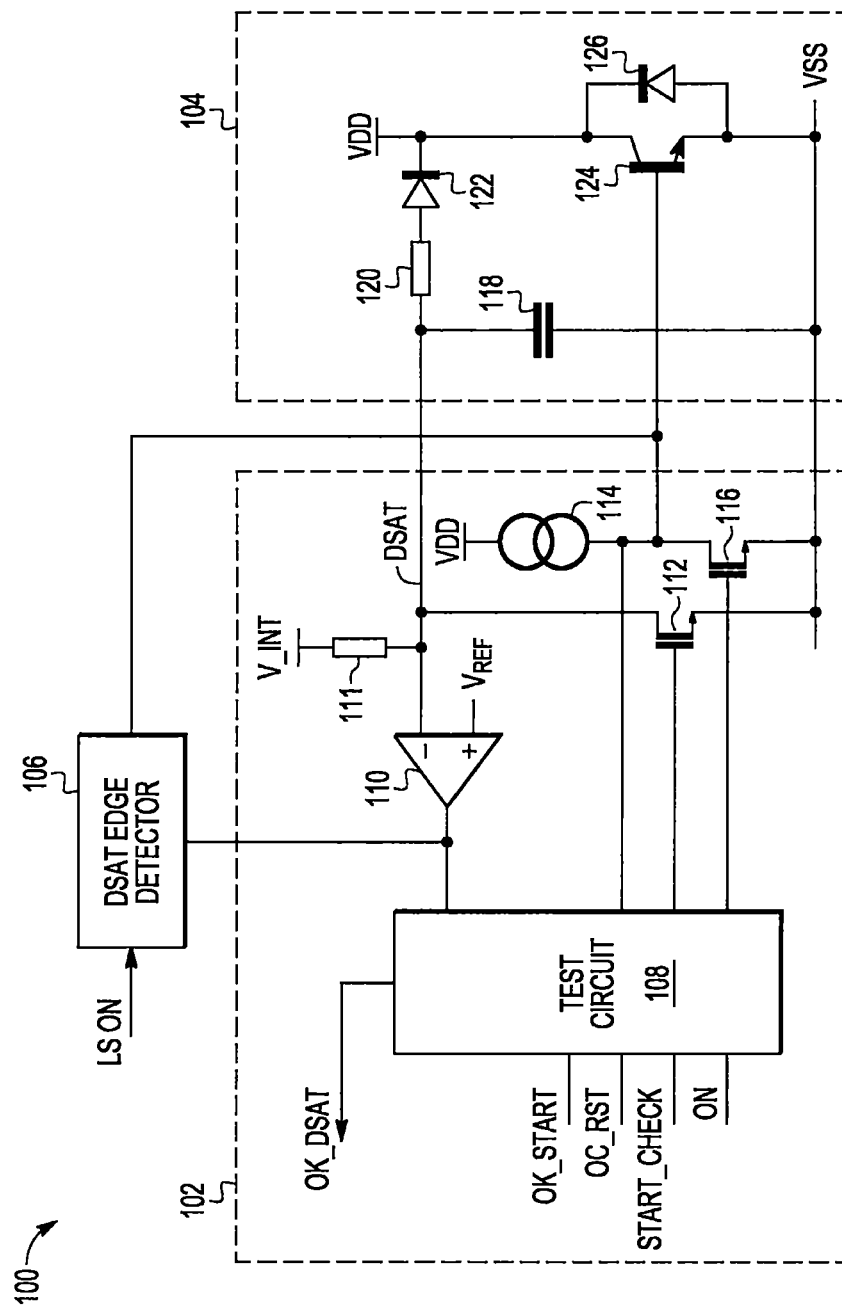
FIG. 1 illustrates a block diagram of an over-current protection test system for an IGBT device in accordance with an embodiment.

FIG. 1 illustrates a block diagram of an over-current protection test system 100 for IGBT 124 in accordance with an embodiment that includes driver circuit 102 and desaturation edge detector circuit 106 coupled to IGBT circuit 104. Driver circuit 102 includes test circuit 108, comparator 110, internal voltage supply (V_INT) coupled to resistor 111, N-channel transistors 112, 116, and current source 114. IGBT circuit 104 includes capacitor 118, resistor 120, diodes 122, 126, and IGBT 124.

Test circuit 108 is coupled to receive several input signals including a start signal (OK_START), reset signal (OK_RST), start check (START_CHECK), and an on signal (ON), and to provide a signal (OK_DSAT) indicating whether the protection circuitry is operating properly. Test circuit 108 is also coupled to output from comparator 110 (COMP), a first terminal of current source 114, gate electrodes of transistors 112, 116, 124. Comparator 110 includes a first input coupled to node DSAT and a second input coupled to reference voltage VREF. Transistor 112 includes a drain electrode coupled to node DSAT and a source electrode coupled to supply voltage VSS. Transistor 116 includes a drain electrode coupled to a second terminal of current source 114 and a source electrode coupled to supply voltage VSS. A first terminal of resistor 111 is coupled to internal voltage supply (V_INT) and a second terminal of resistor 111 is coupled to node DSAT.

In IGBT circuit 104, capacitor 118 includes a first terminal coupled to node DSAT and a second terminal coupled to supply voltage VSS. Resistor 120 includes a first terminal coupled to node DSAT and a second terminal coupled to the anode of diode 122. A cathode of diode 122 is coupled to a collector of IGBT 124. An emitter of IGBT 124 is coupled to supply voltage VSS. Diode 126 includes an anode coupled to the emitter of IGBT 124 and a cathode coupled to the collector of IGBT 124.

Figure 2:
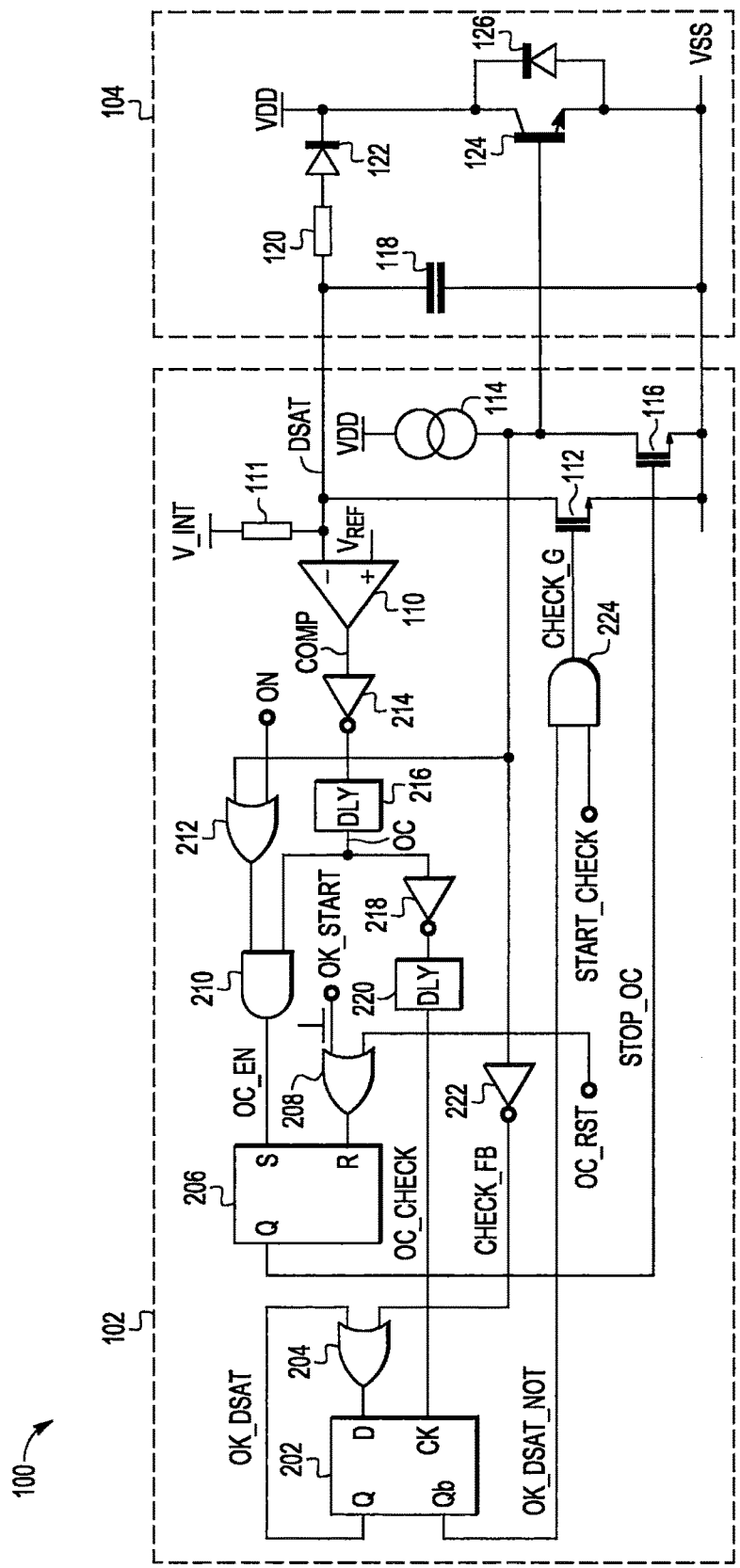
FIG. 2 illustrates a schematic diagram of the over-current protection test circuit of FIG. 1.

FIG. 2 illustrates a schematic diagram of the over-current protection test circuit 102 of FIG. 1 including signal edge detector (flip-flop) 202, OR gates 204, 208, 212, set/reset latch 206, AND gates 210, 224, inverters 214, 218, 222, and delay modules 216, 220.

Latch 202 includes a first input (CK) coupled to a clock signal (OC_CHECK), a second input (D) coupled to the output of OR gate 204, a first output (Q) coupled to an input of OR gate 204, and a second output (Q_bar—complement of Q) coupled to a first input to AND gate 224. A second input to OR gate 204 is coupled to an output (CHECK_FB signal) of inverter 222.

Latch 206 includes a set input (S) coupled to an output of AND gate 210, a reset input (R) coupled to an output of OR gate 208, and an output (Q) coupled to provide a stop over-current (STOP_OC) signal that is coupled to the gate electrode of transistor 116.

OR gate 208 includes a first input coupled to a start signal (OK_START), and a second input coupled to a reset signal (OC_RST).

AND gate 210 includes a first input coupled to an over-current enable signal (OC_EN) output by OR gate 212 and a second input coupled to the output of delay module 216.

OR gate 212 includes a first input coupled to coupled to the Q_BAR output of latch 202 and a second input coupled to an on signal (ON).

Inverter 214 includes an input coupled to the output of comparator 110 (COMP) and an output coupled to an input of delay module 216. An output of delay module 216 is coupled to an input to AND gate 210 and an input to inverter 218. An output of inverter 218 is coupled to an input of delay module 220.

Inverter 222 includes an input coupled to the output terminal of current source 114. An output (CHECK_FB) of inverter 222 is coupled to an input of OR gate 204.

AND gate 224 includes a first input coupled to a second output (Q_BAR) of latch 202 (labeled as OK_DSAT_NOT), a second input coupled to a start check signal (START_CHECK), and an output (CHECK_G) coupled to the gate electrode of N-channel transistor 112.

The operation of test system 100 will now be described with reference to FIGS. 3 and 4, which illustrates a timing diagram of the state of various signals during operation of the test circuit 102 of FIG. 2. Test system 100 tests the functionality of over-current protection for IGBT 124 before IGBT 124 is placed in active mode. If the protection circuitry is not functioning, IGBT 124 remains in-active.

Figure 3:
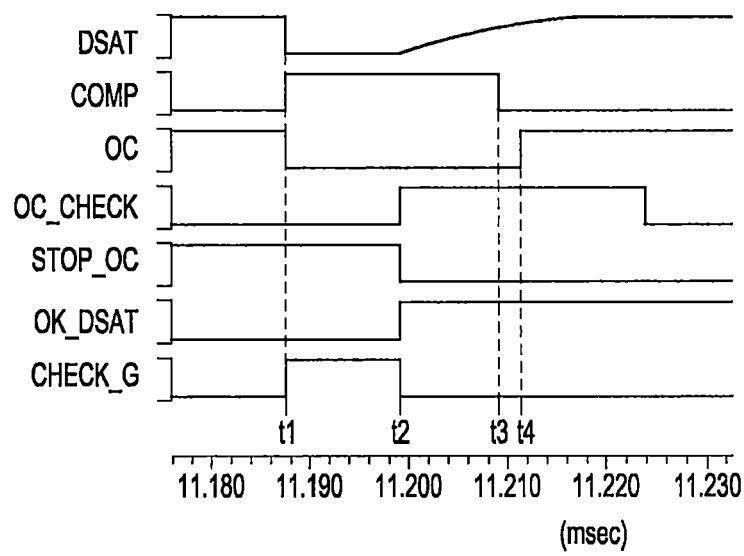
FIG. 3 illustrates a timing diagram of various signals during operation of the test circuit of FIG. 2.

Referring to FIGS. 2 and 3, during an over current protection test mode, transistor 112 is configured to replace IGBT 124 to pull down voltage at node DSAT. At the start of a test period, IGBT 124 and transistor 112 are inactive, the internal voltage supply is set to a specified voltage, such as 10 Volts, for example, and the voltage at node DSAT is pulled high. The output (COMP) of comparator 110 is low. The OK_DSAT_NOT signal at an input to the AND gate 224 is already high. When the START_CHECK signal at another input to AND gate 224 is set high to initiate testing of the saturation current (DSAT) protection, the CHECK_G signal output by AND gate 224 goes high. The CHECK_G signal enables transistor 112 to pull down the voltage at node DSAT at time T1. If the voltage at node DSAT goes low, an over-current condition is not detected and the OC signal output by comparator 110 and delay module 216 goes low. Conversely, when the voltage at node DSAT remains high due to a fault in the protection circuitry, an over-current condition is detected.

The START_CHECK signal is only enabled during the over-current test, so the CHECK_G signal will also only activate transistor 112 during the over-current protection test.

When the saturation current (DSAT) protection is determined to be functioning correctly, the OK_START signal is set to reset latch 206, setting the STOP_OC signal low. If the reset function of latch 206 is not functioning properly, latch 206 will not reset and the STOP_OC signal will stay high, thereby preventing IGBT 124 from turning on. If latch 206 is functioning properly, IGBT 124 is allowed to operate.

When the OK_DSAT_NOT signal is high, the set function of latch 206 is disabled. The ON signal at an input to OR gate 212 goes high when IGBT 124 is turned on, and the set function of latch 206 operates when an over-current condition is detected after IGBT 124 is turned on.

If latch 206, transistor 116, and comparator 110 are functioning properly, the CHECK_FB signal is high. The positive edge of the OC_CHECK signal can be delayed by a specified amount of time by delay module 220, for example, 20 microseconds. The delayed time is shown as time T2 in FIG. 3. The CHECK_FB signal is stored in edge detector 202. When the CHECK_FB signal is high, the OK_DSAT signal output by edge detector 202 is set high, which indicates the over-current protection circuitry is operating properly. When the over-current protection circuitry is operating properly, the CHECK_G signal will be low causing transistor 112 to be inactive.

In the event of a very high over-current condition, for example, greater than 2000 Amps, transistor 116 can be used to turn the gate of IGBT 124 off slowly to avoid overshoot in the collector-emitter voltage (VCE) that could otherwise damage IGBT 124. The STOP_OC signal output by latch 206 remains high even if the over-current condition is removed, driving transistor 116 to turn off IGBT 124 slowly. Current source 114 provides current at the drain electrode of transistor 116 to check that transistor 116 is connected to control gate of IGBT 124. If the connection is functioning, the drain of transistor 116 goes low and the CHECK_FB signal output by inverter 222 goes high.

Figure 4:
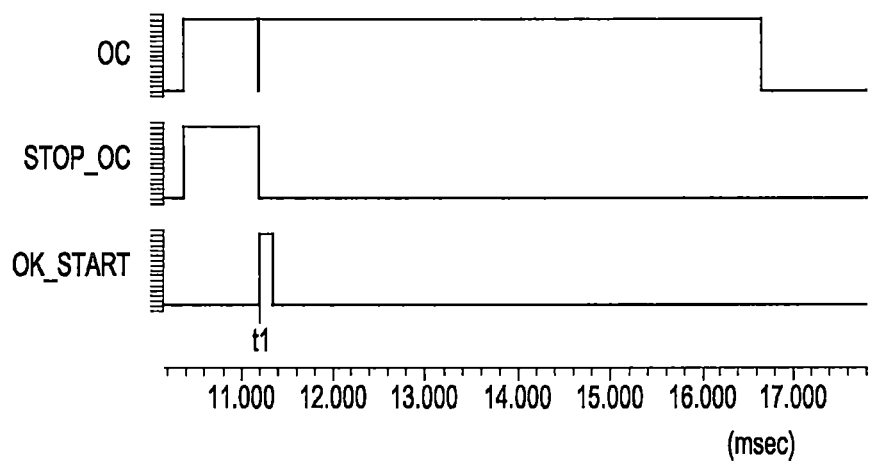
FIG. 4 illustrates a timing diagram of additional signals during operation of the test circuit of FIG. 2.

FIG. 4 illustrates a timing diagram of additional signals during operation of the test circuit of FIG. 2. When the over-current protection circuitry is operating properly, the OK_START signal is set high and latch 206 is reset causing the STOP_OC signal to go low. If the reset function of latch 206 does not work, the STOP_OC signal will stay high and the IGBT 124 will not be able to turn on. If the reset function of latch 206 does work, the OK_DSAT_NOT signal disables the set function of latch 206 and only the ON signal can enable the set function of latch 206 to be ready to latch if an over-current condition exists after IGBT 124 is turned on.

Figure 5:
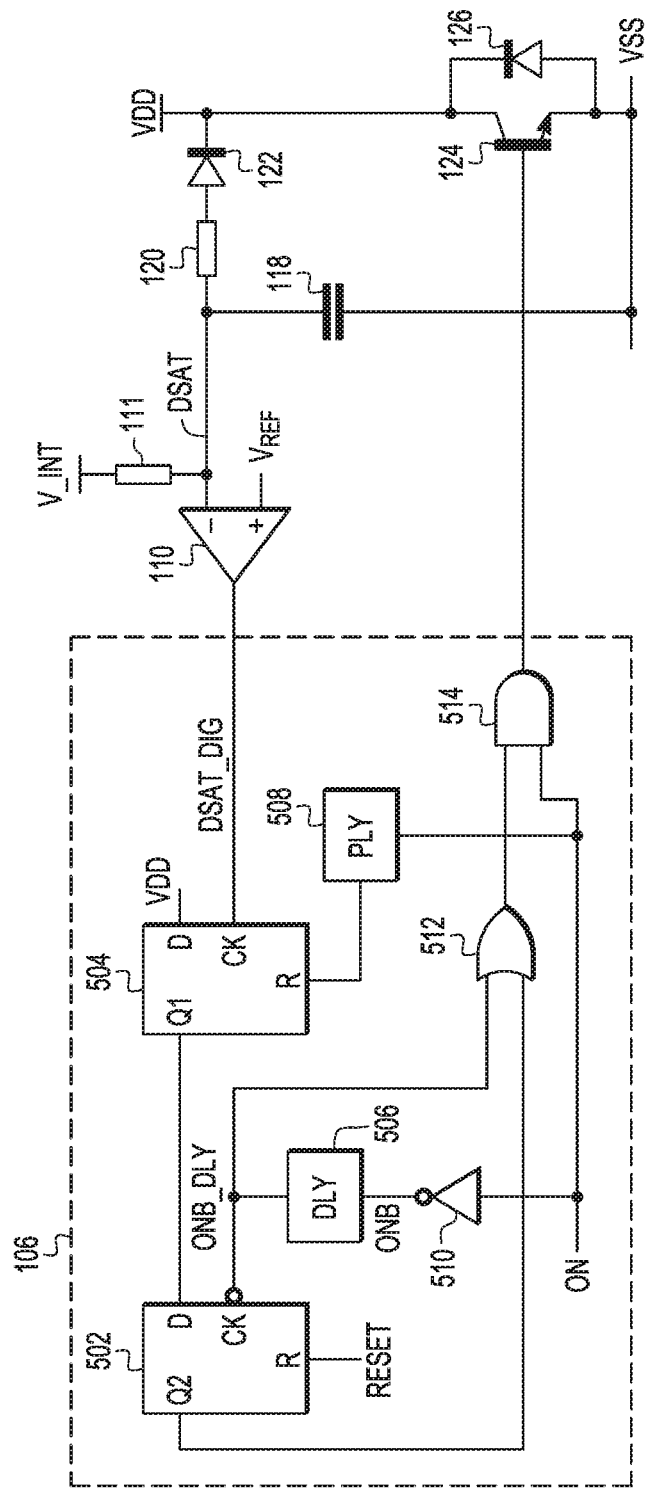
FIG. 5 illustrates a schematic diagram of an embodiment of an edge detector circuit for the over-current protection test circuit of FIG. 1.

FIG. 5 illustrates a schematic diagram of an embodiment of an edge detector flip-flop circuit 106 for the over-current protection test circuit 100 of FIG. 1 including flip-flop circuits 502, 504, delay module 506, pulse module 508, inverter 510, OR gate 512 and AND gate 514. Flip-flop 502 include a first input (D) coupled to an output (Q1) of flip-flop 504, an enable input (CK) coupled to a delayed, inverted on signal (ONB_DLY) from delay module 506, a reset input (R), and an output (Q2) coupled to an input of OR gate 512. Flip-flop 504 include a first input (D) coupled to supply voltage (VDD), an enable input (CK) coupled to a digital de-saturation signal (DSAT_DIG) from comparator 110, a reset input (R) from pulse module 508, and an output (Q1) coupled to the first input (D) of flip-flop 502.

Delay module 506 includes an input coupled to the output of inverter 510 and an output that provides the delayed, inverted on signal (ONB_DLY) to flip-flop 502. Pulse module 508 includes an input coupled to an on signal (ON) and an output that provides the a reset signal to flip-flop 504. Inverter 510 has an input coupled to the on signal (ON) and an output that provides an inverted on signal (ONB) to delay module 506.

OR gate 512 includes a first input coupled to the delayed, inverted on signal (ONB_DLY) and a second input coupled to the Q2 output of flip-flop 502. AND gate 514 includes a first input coupled to the output of OR gate and a second input coupled to the on signal (ON). The output of AND gate 514 is coupled to the control gate of IGBT 124.

Referring to FIGS. 1 and 5, edge detector circuit 106 improves the reliability of over current protection circuitry for IGBT 124 by detecting an over-current transition signal and using the signal to determine whether an open or short-circuit condition exists at the DSAT node that would otherwise not be detected by test circuitry 108. For example, if there is an open circuit at the DSAT node, test circuitry 108 will detect a false over-current and turn off IGBT 124. Conversely, if the DSAT node is shorted, test circuitry 108 will not detect an over-current condition and allow IGBT 124 to operate in over-current conditions, which could damage IGBT 124.

Figure 6:
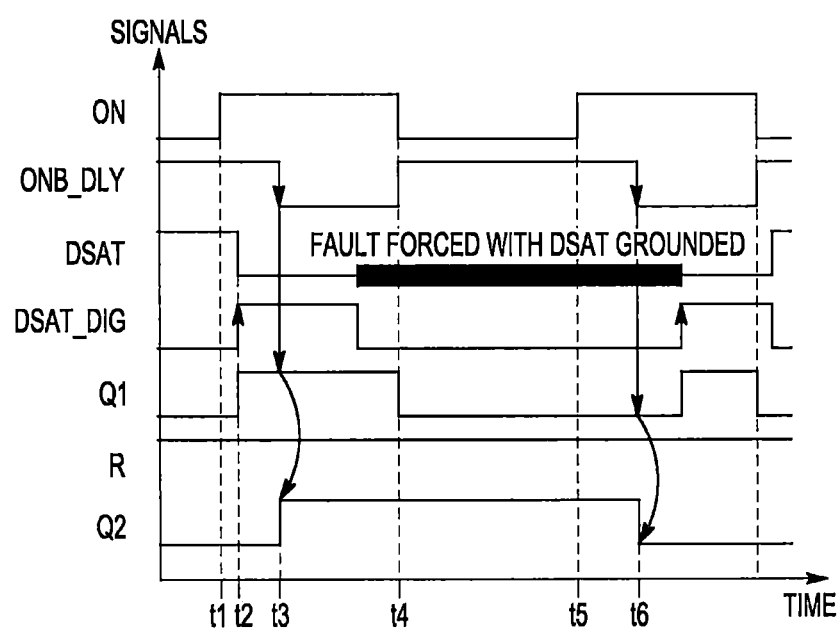
FIG. 6 illustrates a timing diagram of various signals during operation of the edge detector circuit of FIG. 5.

Referring to FIGS. 5 and 6, FIG. 6 illustrates a timing diagram of various signals during operation of the edge detector circuit 106 of FIG. 5. In the embodiment shown edge detector circuit 106 is configured to detect the falling edge of voltage at the DSAT node, however, edge detector circuit 106 can alternatively be configured to detect the rising edge of voltage at the DSAT node. At time T1, the on signal (ON) is asserted. At the transition of the voltage at the DSAT node to low at time T2, the DSAT_DIG signal output by comparator 110 transitions to high and the output of flip-flop 504 (Q1) is latched. At time T3, the output of delay module 506 (ONB_DLY) transitions from high to low, causing the Q2 signal at the output of flip-flop 502 to latch high. A fault is simulated by forcing the voltage at the DSAT node low between time T3 and T4, causing the DSAT_DIG signal to go low. At time T4, the ON signal goes low, causing the ONB_DLY signal output by delay module 506 to go high. Note that in the example shown, only the negative edge of the ONB_DLY signal is delayed, for example, between 2 and 4 microseconds. The delay time allows the voltage at the DSAT node to go low. A delay for the positive edge of the ONB_DLY signal is not required. The output of flip-flop 504 goes low and flip-flop 504 is reset by a pulsed ON signal from pulse module 508. The output of flip-flop 502 remains high.

To detect a fault, edge detector 106 is forced on a second time to see whether the output of flip-flop 504 changes. In particular, at time T5, The ON signal goes high again and the ONB_DLY signal goes low at time T6 after the delay introduced by delay module 506 passes. If no falling edge in the voltage at the DSAT node is detected, Q1 output by flip-flop 504 remains low and Q2 transitions low when the ONB_DLY signal goes low to enable flip-flop 502 to latch the data output by flip-flop 504.

By now it should be appreciated that in some embodiments, there has been provided a saturation edge detection circuit [106] for testing a saturation level in an insulated gate bipolar transistor ("IGBT") that can include a first input operable to receive an on signal [LSon]; a second input coupled to an IGBT driver circuit; and an output coupled to a control electrode of the IGBT. The output indicates a change in a state of a saturation voltage associated with the IGBT during operation of the IGBT.

In another aspect, the saturation edge detection circuit can comprise a first latch [504] can have a first input coupled to a second supply voltage and a second input coupled to an output of a comparator, the comparator being part of the IGBT driver circuit. A second latch [502] can have a first input coupled to an output of the first latch, and a second input operable to receive a delayed on signal [LSon_dly].

In another aspect, the first latch is a D flip-flop.

In another aspect, the second latch is a D flip-flop.

In another aspect, the output is to indicate the change in the state of the saturation voltage by means of a logical operation of the on signal and the delayed on signal.

In another aspect, the first latch further comprises a reset input coupled to a pulse module.

In another aspect, the delayed on signal is an inverted, delayed variant of the on signal.

In another aspect, the saturation edge detection circuit can further comprise an inverter [510] having an input operable to receive the on signal [LSon], a delay module [506] having an input coupled to an output of the inverter and an output operable to provide the delayed on signal, a pulse module [508] having an input operable to receive the on signal and an output coupled to a reset input of the first latch, an OR gate [512] having a first input coupled the on signal, a second input coupled to an output of the second latch, and an AND gate [514] having a first input coupled to an output of the OR gate, a second input operable to receive the on signal, and an output coupled to the control electrode of the IGBT.

In another embodiment, a method for testing a saturation level in an insulated gate bipolar transistor ("IGBT") can comprise receiving an on signal [LSon], receiving a signal indicating whether a voltage level at a test saturation node [DSAT] of an IGBT driver circuit is above a threshold voltage, storing a state associated with the voltage level, storing information associated with a change in the voltage level, performing a logical operation with the state associated with the voltage level and the information associated with the change in the voltage level, and in response to the logical operation, lowering a control voltage on a control electrode of the IGBT.

In another aspect, storing a state associated with the voltage level can be performed by a D flip-flop.

In another aspect, storing information associated with the change in the voltage level can be performed by a D flip-flop.

In another aspect, the D flip-flop comprises a reset input coupled to a pulse module.

In another aspect, the D flip-flop comprises a clock input coupled an inverted, delayed variant of the on signal.

In another aspect, storing a state associated with the voltage level can be performed by a D flip-flop.

In another aspect, storing information associated with the change in the voltage level can be performed by a D flip-flop.

In another aspect, the D flip-flop comprises a reset input coupled to a pulse module.

In another aspect, the D flip-flop comprises a clock input coupled a delayed variant of the on signal.

In another aspect, the delayed variant of the on signal can be an inverted, delayed variant of the on signal.

In another aspect, the D flip-flop comprises an input coupled to a supply voltage.

In another aspect, the D flip-flop comprises an input coupled to the IGBT driver circuit.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A saturation edge detection circuit for testing a saturation level in an insulated gate bipolar transistor ("IGBT"), the circuit comprising:
    a first input operable to receive an on signal;
    a second input coupled to an IGBT driver circuit; and
    an output coupled to a control electrode of the IGBT, the output operable to indicate a change in a state of a saturation voltage associated with the IGBT during operation of the IGBT;
    a first latch having a first input coupled to a supply voltage and a second input coupled to an output of a comparator, the comparator being part of the IGBT driver circuit;
    a second latch having a first input coupled to an output of the first latch, and a second input operable to receive a delayed on signal.

2. The circuit of claim 1, wherein the first latch is a D flip-flop.

3. The circuit of claim 1, wherein the second latch is a D flip-flop.

4. The circuit of claim 1, wherein the output is to indicate the change in the state of the saturation voltage by means of a logical operation of the on signal and the delayed on signal.

5. The circuit of claim 1, wherein the first latch further comprises a reset input coupled to a pulse module.

6. The circuit of claim 1, wherein the delayed on signal is an inverted, delayed variant of the on signal.

7. The circuit of claim 1, wherein the saturation edge detection circuit further comprises an inverter having an input operable to receive the on signal.

8. The circuit of claim 7, wherein the saturation edge detection circuit further comprises a delay module having an input coupled to an output of the inverter and an output operable to provide the delayed on signal.

9. The circuit of claim 1, wherein the saturation edge detection circuit further comprises a pulse module having an input operable to receive the on signal and an output coupled to a reset input of the first latch.

10. The circuit of claim 1, wherein the saturation edge detection circuit further comprises an OR gate having a first input coupled to the on signal, and a second input coupled to an output of the second latch.

11. The circuit of claim 10, wherein the saturation edge detection circuit further comprises an AND gate having a first input coupled to an output of the OR gate, a second input operable to receive the on signal, and an output coupled to the control electrode of the IGBT.

12. The circuit of claim 1, wherein the first latch is a D flip-flop and the second input of the first latch is a clock input, and wherein the second latch is a D flip-flop and the second input of the second latch is a clock input.

13. A method for testing a saturation level in an insulated gate bipolar transistor ("IGBT"), the method comprising:
    receiving an on signal;
    receiving a signal indicating whether a voltage level at a test saturation node of an IGBT driver circuit is above a threshold voltage;
    storing a state associated with the voltage level;
    storing information associated with a change in the voltage level;
    performing a logical operation with the state associated with the voltage level and the information associated with the change in the voltage level; and
    in response to the logical operation, lowering a control voltage on a control electrode of the IGBT.

14. The circuit of claim 13, wherein storing a state associated with the voltage level is performed by a D flip-flop.

15. The circuit of claim 14, wherein the D flip-flop comprises a reset input coupled to a pulse module.

16. The circuit of claim 15, wherein the D flip-flop comprises an input coupled to a supply voltage.

17. The circuit of claim 15, wherein the D flip-flop comprises an input coupled to the IGBT driver circuit.

18. The circuit of claim 13, wherein storing information associated with the change in the voltage level is performed by a D flip-flop.

19. The circuit of claim 18, wherein the D flip-flop comprises a clock input coupled a delayed variant of the on signal.

20. The circuit of claim 19, wherein the delayed variant of the on signal is an inverted, delayed variant of the on signal.

* * * * *